United States Patent [19]

Harada

[11] Patent Number: 5,894,428
[45] Date of Patent: Apr. 13, 1999

[54] RECURSIVE DIGITAL FILTER

[75] Inventor: Hiroyuki Harada, Tokyo, Japan

[73] Assignee: Mitsubishi Denki Kabushiki Kaisha, Tokyo, Japan

[21] Appl. No.: 08/901,782

[22] Filed: Jul. 28, 1997

[30] Foreign Application Priority Data

Feb. 20, 1997 [JP] Japan ................. 9-035821

[51] Int. Cl.$^6$ ................. G06F 7/38; G06F 17/10
[52] U.S. Cl. ................. 364/724.03; 364/724.17; 364/745.02
[58] Field of Search ................. 364/724.03, 724.17, 364/745.02

[56] References Cited

U.S. PATENT DOCUMENTS

| | | | |
|---|---|---|---|
| 4,236,224 | 11/1980 | Chang | 364/724.03 |
| 4,589,084 | 5/1986 | Fling et al. | 364/745.02 |
| 4,920,507 | 4/1990 | Takeda | 364/724.03 |
| 5,218,563 | 6/1993 | Juri et al. | 364/745.02 |
| 5,463,570 | 10/1995 | Nakata | 364/745.02 |
| 5,696,710 | 12/1997 | Hague et al. | 364/745.02 |

FOREIGN PATENT DOCUMENTS 62-3517  9/1987  Japan.

OTHER PUBLICATIONS

Ochi, Hiroshi; "Introduction to Digital Filter Design"; CO Publishers Inc., Japan May 30, 1990.

*Primary Examiner*—Tan V. Mai
*Attorney, Agent, or Firm*—Leydig, Voit & Mayer

[57] ABSTRACT

A recursive digital filter has a recursive arithmetic operation circuit and an output compensation circuit. The output compensation circuit outputs a value of zero as output data of the recursive digital filter, even if the data input to the recursive arithmetic operation circuit is zero.

11 Claims, 4 Drawing Sheets

COEFFICIENT TABLE
K0 : 0.09375
F11 : -1.265625
F12 : -0.78125
-R11 : 1.4375
-R21 : -0.921875
-R12 : 1.390625
-R22 : -0.671875
-R13 : 0.671875

COEFFICIENT TABLE
K0 : 0.09375
F11 : -1.265625
F12 : -0.78125
-R11 : 1.4375
-R21 : -0.921875
-R12 : 1.390625
-R22 : -0.671875
-R13 : 0.671875

RECURSIVE DIGITAL FILTER

BACKGROUND OF THE INVENTION

1. Field of the Invention

The present invention relates to a recursive type digital filter having a feedback path.

2. Description of the Prior Art

FIG. 6 is a diagram showing a configuration of a conventional recursive type digital filter. In FIG. 6, the reference number 1 designates an input terminal through which a data item is received and inputted to the recursive type digital filter, 2 denotes a plurality of multipliers, 3 denotes a plurality of adders, 4 indicates a plurality of registers for storing data as delay values for the input data, and 5 designates an output terminal through which the data is output as output data to outside of the conventional recursive type digital filter.

Each multiplier 2 multiplies data by a coefficient in a coefficient table shown in FIG. 1. This conventional recursive type digital filter is capable of performing a 20 bit significant digit arithmetic operation.

Next, a description will now be given of the operation of the conventional recursive type digital filter shown in FIG. 6.

In general, the conventional recursive type digital filter is used for digital signal processing of audio devices, for example. This digital filter inputs an audio digital signal and performs a predetermined operation for the received audio digital data and outputs the audio digital signal without noise to external devices.

In FIG. 6, the multiplier 2 multiplies a data item such, as the input data item received through the input terminal 1, by a pre-set coefficient value that has been set previously. The input data item is added by the adder 3 and delayed in time using data stored in the register 4. Finally, the desired audio digital data item is provided through the output terminal 5 to external devices.

In addition to this feature, as shown in FIG. 6, the conventional recursive type digital filter has a feedback path. When data is received once through the input terminal 1, the operation result is fed back to the input terminal 1 through the feedback path. Thereby, the data that does not satisfy causality is output through the output terminal 5 to external devices.

Since the conventional recursive type digital filter has the configuration described above, there is a drawback in which the output data from the output terminal 5 can not converge to zero, namely, the phenomenon of a limit cycle occurs, by a rounding error caused by the operation of a limited significant digit as the 20 bit significant digit even if the input data item becomes "0".

This phenomenon will now be explained in detail by using numerical values.

Firstly, an optional data item is inputted to the input terminal 1. Secondly, the data "0" is inputted through the input terminal 1, for example. In addition, when the data as the operation result converges to zero from a positive value, the 20 bit data item is changed as follows:

000000000000000.0010 (2), 000000000000000.0001 (2), and 000000000000000.0000 (2).

Thus, the 20 bit data item approaches "0" at every repeating of the data output through the output terminal 5. After this, the output data converges to zero.

However, the conventional recursive type digital filter shown in FIG. 6 has a drawback that the output data item converges toward zero and converges to $-1$ when the output data item converges to zero from a negative value. Therefore it is difficult for the output data item to converge to zero correctly. This 20 bit data item is expressed by using a 2's complement notation as follows:

111111111111111.1101 (2), 111111111111111.1110 (2), and 111111111111111.1111 (2), where the most significant bit indicates a sign bit.

SUMMARY OF THE INVENTION

Accordingly, an object of the present invention is, with due consideration to the drawbacks of the conventional recursive type digital filter, to provide a recursive type digital filter that is capable of outputting the value of zero correctly through the output terminal of the recursive type digital filter even if the value of zero (0) value is received as an input data item.

In accordance with a preferred embodiment of the present invention, a recursive type digital filter comprises a recursive type arithmetic operation circuit for performing an arithmetic operation for input data of predetermined significant digits and for providing output data of a desired frequency characteristic, and an output compensation circuit for compensating the output data provided from the recursive type arithmetic operation circuit so that the recursive type digital filter outputs data of zero even if data of zero is inputted to the recursive type arithmetic operation circuit.

In a recursive type digital filter as another preferred embodiment of the present invention, the output compensation circuit specifies in advance a value of a rounding error as a fixed data item caused when the data of zero is inputted to the recursive type arithmetic operation circuit in accordance with the significant digits of the recursive type arithmetic operation circuit and coefficients used for the operation in the recursive type arithmetic operation circuit and adds the output data item provided from the recursive type arithmetic operation circuit with the fixed data item.

In a recursive type digital filter as another preferred embodiment of the present invention, the recursive type arithmetic operation circuit performs the arithmetic operation for the input data of m significant digits (m is an optional natural number, not less than 2) and outputs the output data of the desired frequency characteristic, and when a following circuit located at following stage of the recursive type digital filter uses a data item of a n significant digits (n is a natural number and n<m) in the output data of the m significant digits provided from the recursive type digital filter, the output compensation circuit stores a data item of (m−n) significant digits, as a fixed data item in advance, counted from the least significant digit in the output data from the recursive type arithmetic operation circuit, and adds the output data provided from the recursive type arithmetic operation circuit with the fixed data item.

In a recursive type digital filter as another preferred embodiment of the present invention, the output compensation circuit comprises a code decision circuit for deciding a code of the output data provided from the recursive type arithmetic operation circuit, and an addition circuit for adding the output data provided from the recursive type arithmetic operation circuit with the fixed data item when the code decision circuit decides that the output data provided from the recursive type arithmetic operation circuit is a negative value.

In a recursive type digital filter as another preferred embodiment of the present invention, the output compensation circuit comprises a register for storing the fixed data item and an addition circuit for adding the output data provided from the recursive type arithmetic operation circuit with the fixed data item stored in the register.

In a recursive type digital filter as another preferred embodiment of the present invention, the output compensation circuit comprises a register for storing the fixed data item and an addition circuit for adding the output data provided from the recursive type arithmetic operation circuit with the fixed data item stored in the register.

In a recursive type digital filter as another preferred embodiment of the present invention, the addition circuit comprises a plurality of full adders.

In a recursive type digital filter as another preferred embodiment of the present invention, the output compensation circuit comprises a full adder, a flip flop circuit, and a register, wherein the flip flop circuit carries the output result of the addition operation, provided by the full adder, between the output data provided from the recursive type arithmetic operation circuit and the fixed data item stored in the register 810) by one digit when a carry is happened.

In a recursive type digital filter as another preferred embodiment of the present invention, the register stores an optional data item, as the fixed data item, whose significant digit value is a value corresponding to a difference between both significant digits of the recursive type arithmetic operation circuit and the following circuit when the significant digit of the recursive type arithmetic operation circuit is greater than the significant digit of the following circuit.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

Preferred embodiments of the recursive type digital filter according to the present invention will now be described with reference to the drawings.

First embodiment

Figure 1:
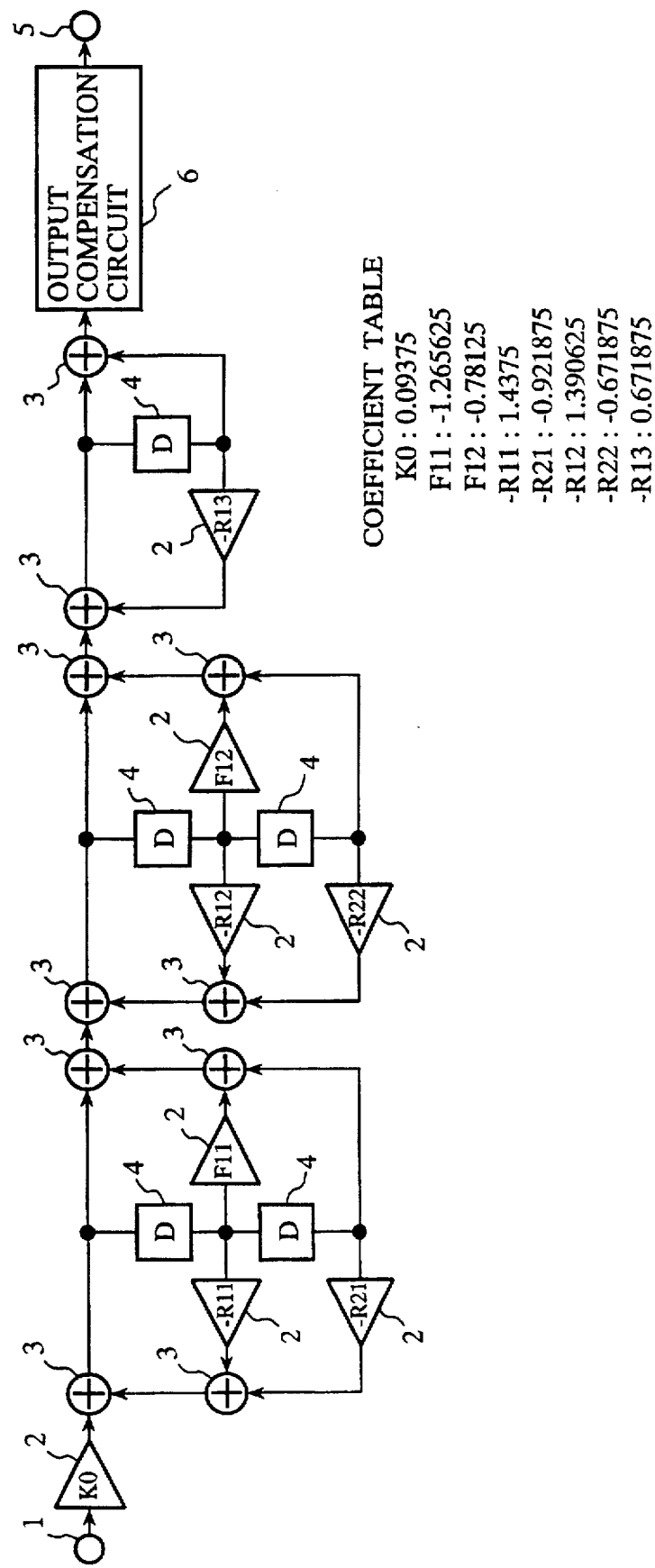
FIG. 1 is a block diagram showing a configuration of a recursive type digital filter as the first embodiment of the present invention.

FIG. 1 is a block diagram showing a configuration of a recursive type digital filter as the first embodiment of the present invention. In FIG. 1, the reference number 1 designates an input terminal of the recursive type digital filter through which a data item is inputted to the recursive type digital filter, 2 denotes a plurality of multipliers (recursive type arithmetic operation circuits), 3 denotes a plurality of adders (recursive type operation arithmetic operation circuit), 4 indicates a plurality of registers (recursive type arithmetic operation circuits) for storing delay data items indicating delay values for the input data, and 5 designates an output terminal of the recursive type digital filter through which the data is provided as output data to external devices of the recursive type digital filter. In addition to those components, the recursive type digital filter of the first embodiment comprises an output compensation circuit connected to the output terminal 5 for compensating the output data. In FIG. 1, each multiplier 2 multiplies data by using designated coefficient. In addition, the recursive type digital filter of the first embodiment having the configuration shown in FIG. 1 performs a 20 bit significant digit arithmetic operation.

Figure 2:
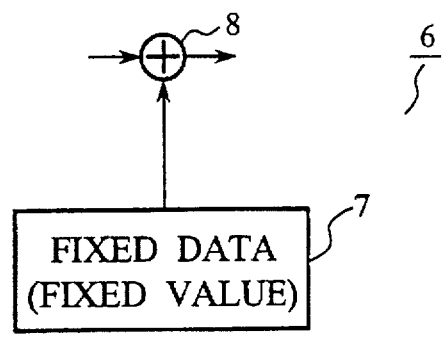
FIG. 2 is a block diagram showing a detailed configuration of an output compensation circuit incorporated in the recursive type digital filter of the first embodiment shown in FIG. 1.

FIG. 2 is a block diagram showing a detailed configuration of the output compensation circuit 6 incorporated in the recursive type digital filter of the first embodiment shown in FIG. 1. In FIG. 2, the reference number 7 designates a fixed data register for storing a fixed data item. This fixed data item is a canceling data item to cancel a rounding error. The value of this rounding error has been calculated in advance for the case when a data item of zero is inputted to the input terminal 1 based on the configuration of the recursive type digital filter such as the significant digit and the coefficients used by the multiplier 2. The reference number 8 designates an addition circuit for adding the arithmetic operation result of the arithmetic operation circuit in the recursive type digital filter with the fixed data item stored in the fixed data register 7.

Figure 3:
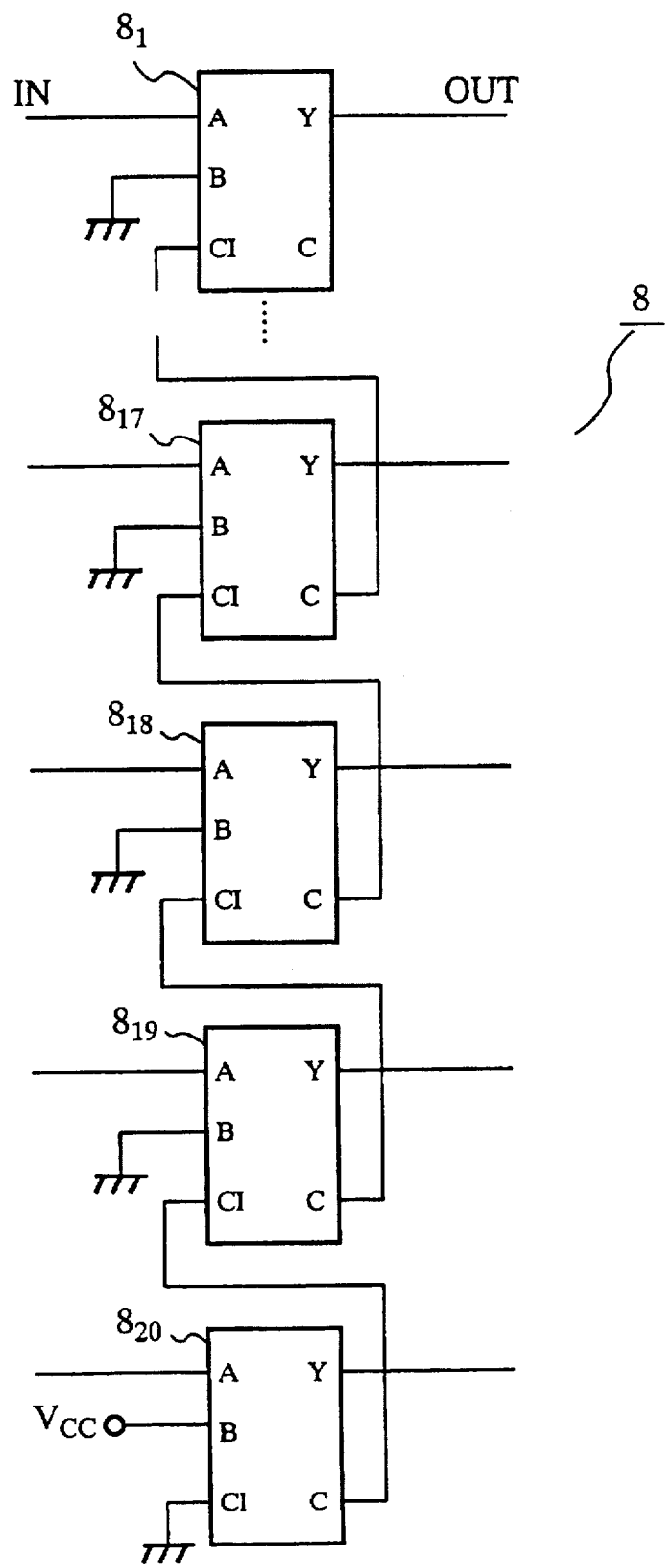
FIG. 3 is a block diagram showing a detailed configuration of an addition circuit in the output compensation circuit shown in FIG. 2.
Figure 6:
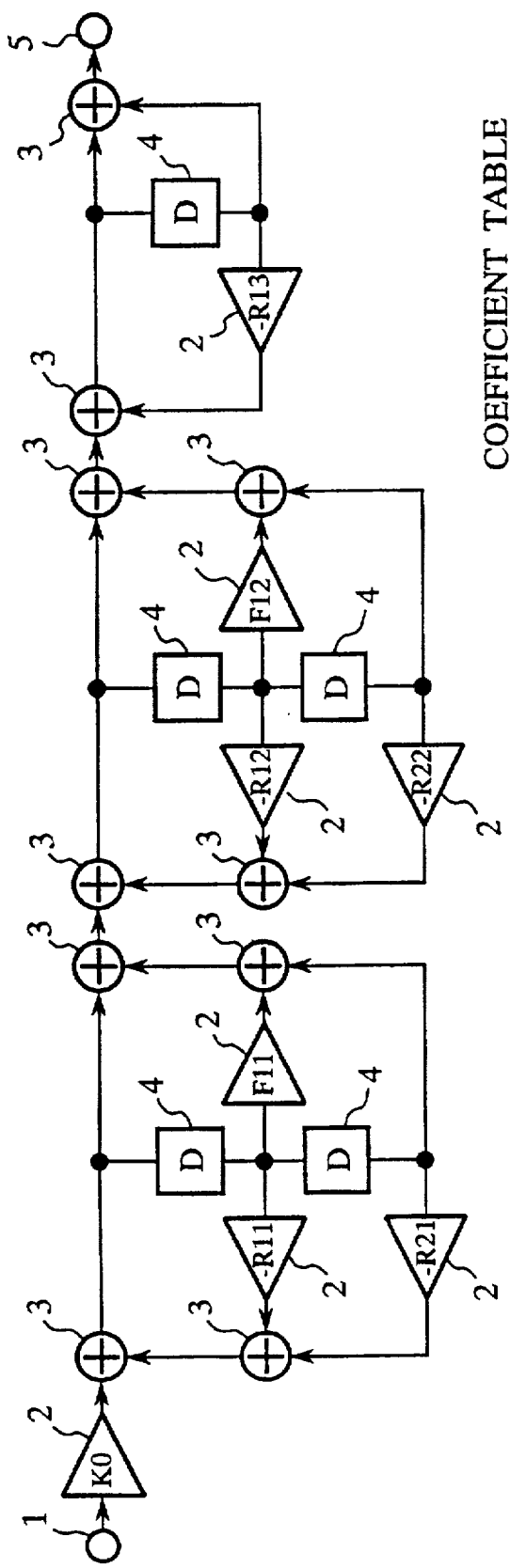
FIG. 6 is a block diagram showing a conventional recursive type digital filter.

FIG. 3 is a block diagram showing a detailed configuration of the addition circuit 8 in the output compensation circuit 6 shown in FIG. 2. In each full adder $8_1, \ldots 8_{17}, 8_{18}, \ldots 8_{20}$, the reference character "A" designates an input terminal of each full adder and "Y" denotes an output terminal of each full adder. In FIG. 3, the reference numbers $8_1, \ldots 8_{17}, 8_{18}, \ldots 8_{20}$ designate full adders. The operation result of the arithmetic operation circuit in the 20 bit recursive type digital filter of the first embodiment is inputted into the input terminals A of the full adders $8_1, \ldots 8_{17}, 8_{18}, \ldots 8_{20}$ in parallel and the fixed data item "0000000000000000.0001 (2) is inputted into the terminal B of each of the full adders $8_1, \ldots 8_{17}, 8_{18}, \ldots 8_{20}$. Then, each of the full adders $8_1, \ldots 8_{17}, 8_{18}, \ldots 8_{20}$ adds these values and outputs an added result through the output terminal Y.

Next, a description will now be given of the operation of the recursive type digital filter of the first embodiment.

For example, the recursive type digital filter of the first embodiment shown in FIG. 1 can be applied to digital signal processing field in various audio devices. That is, the recursive type digital filter receives digital data items processes the received digital data items using a desired arithmetic operation in order to remove noise from the received digital data items, and outputs the audio signals.

In FIG. 1, the optional data item received through the input terminal 1 is multiplied by a coefficient that has been set previously in the multiplier 2 and then it is added the adder 2 and delayed by using the data stored in the registers 4 in order to obtain the data item having a desired frequency characteristic.

As shown in FIG. 1, the recursive type digital filter of the first embodiment has the feedback path. When the data item is inputted once through the input terminal 1, the operation result is back to the input terminal 1 through the feedback path. Therefore the data item having no causality can be output through the output terminal 5.

In the conventional recursive type digital filter as a conventional technique, because the arithmetic operation is executed under the configuration of a 20 bit significant digit as a finite significant digit, it is difficult to converge the output data from the output terminal 5 to zero by the rounding error even if the received data item becomes zero after an optional data item is received once through the input terminal 1. That is, the limit cycle occurs in the conventional recursive digital filter.

On the other hand, because the recursive type digital filter of the first embodiment has the configuration shown in FIG. 1, the output terminal 5 can output the output data item of zero even if the input data item of zero is received through the input terminal 1.

The principle of the operation of the recursive type digital filter of the first embodiment will now be explained.

Firstly, the fixed data register 7 shown in FIG. 7 stores a canceling data item to cancel a rounding error as a fixed data item shown in FIG. 2. The value of the rounding error has been calculated in advance for the case when a data item "zero" is inputted to the input terminal 1 based on the configuration of the recursive type digital filter such as the significant digit and the coefficients used by the multiplier 2.

In FIG. 3, the fixed data item stored in the fixed data register 7 is as follows:

0000000000000000.0001 (2).

As shown in FIG. 3, the arithmetic operation result of the 20 bit recursive type digital filter of the first embodiment is provided in parallel to the input terminals (IN) A of the full adders $8_1, \ldots 8_{17}, 8_{18}, \ldots 8_{20}$ forming the addition circuit 8. In addition to this, the fixed data item stored in the fixed data register 7 is added and then the data item is output through the output terminal 5 to external devices.

We will explain the operations described above by using actual data item.

Firstly, an optional data item is inputted through the input terminal 1. After this, the data item of zero is inputted through the input terminal 1. In this case, when the operation result converges from a positive value to zero, this 20 bit data item converges toward zero every output of data as follows:

0000000000000000.0010 (2), 0000000000000000.0001 (2), and 0000000000000000.0000 (2).

After this, the output data item converges to zero. The output data item is approximately zero as follows even if the operation result is added with the fixed data stored in the fixed data register 7:

0000000000000000.0001 (2).

In addition, when the operation result converges from a negative value to zero, the 20 bit data item is expressed by using a 2's complement notation as follows:

1111111111111111.1101 (2), 1111111111111111.1110 (2), and 1111111111111111.1111 (2), where the most significant bit indicates a sign bit.

Thus, the output data item converges to zero. When this output data item and the fixed data item are added, the over flow occurs, so that it is possible that the output data item converges to zero.

In the explanation of the first embodiment, the recursive type digital filter having the 20 bit significant digits is used, but, the present invention is not limited by this, for example, the present invention can be applied to a recursive type digital filter having an optional significant bit number. In this case, the fixed data item is set according to the number of the significant bit numbers in advance into the fixed data register 7. This case has also the same effect of the first embodiment.

In the description of the first embodiment, although the output data item converges to zero by adding the fixed data item stored in the fixed data register 7 when the operation result is changed from the negative value to zero. But, the present invention is not limited by this method, for example, it is possible to set the fixed data item into the fixed data register 7. This fixed data item is shifted from zero by a very short value. If there is no effect that this fixed data item has a bad influence upon following circuits located after the stage of the recursive type digital filter.

As described above, according to the recursive type digital filter of the first embodiment, a rounding error is calculated in advance when the input data item "0" is inputted to the input terminal based on the configuration of the arithmetic operation circuit incorporated in the recursive type digital filter, the value of the significant digit, and the coefficients used by the multipliers 2. In addition to this, the fixed data item that is capable of canceling the value of the rounding error and the operation result of the recursive type digital filter are always added by the addition circuit 8. Therefore the recursive type digital filter of the first embodiment can provide the output data of zero correctly even if the input data of zero is inputted.

Second embodiment

Figure 4:
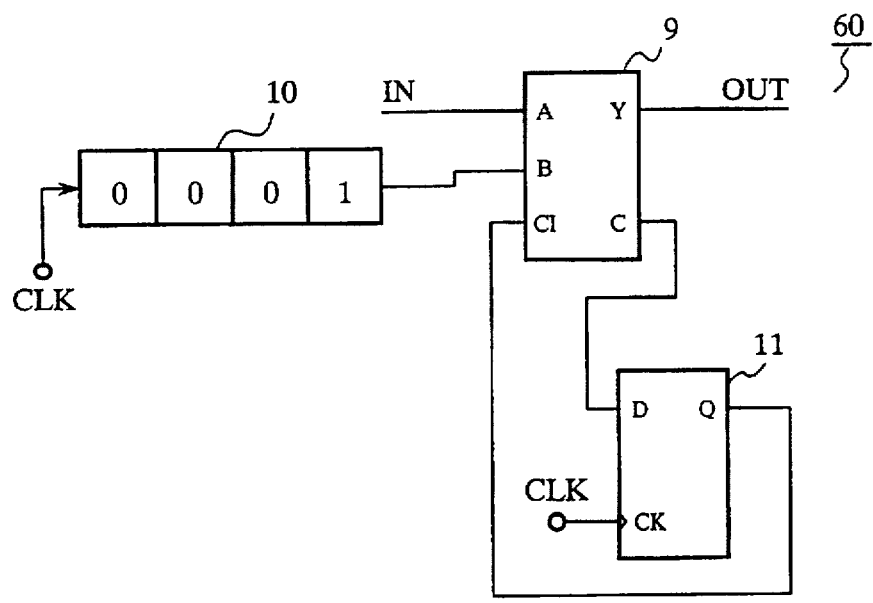
FIG. 4 is a block diagram showing another output compensation circuit as the second embodiment of the present invention.

FIG. 4 is a block diagram showing another output compensation circuit incorporated in the recursive type digital filter as the second embodiment of the present invention.

In FIG. 4, the reference number 9 designates a full adder, 10 denotes a register, and 11 indicates a flip flop. Other components are the same as those of the first embodiment and the explanation of them is omitted here for brevity.

Next, a description will now be given of the operation of the output compensation circuit 60.

Firstly, a rounding error is calculated in advance for the case when the input data item "0" of the recursive type digital filter is inputted to the input terminal based on the configuration of the arithmetic circuit in the recursive type digital filter, the value of the significant digit, and the coefficients used by the multipliers 2. In addition to this, the fixed data item that is capable of canceling the value of the rounding error by the addition circuit 8 is stored in the register 10. In FIG. 4, the fixed data item 0001 (2) is used.

The operation result of the recursive type digital filter of 20 bits is provided into the input terminal A of the full adders 9 and the fixed data of 4 bits stored in the fixed data register 7 is provided into the input terminal B of the full adder 9. The full adder 9 calculates the addition of them. The flip flop 11 adds the upper digit with "1" when a carry occurs in the addition operation.

The output data item can converge to zero by the configuration of the output compensation circuit of the second embodiment as described above. This has the same effect as the first embodiment.

As described above, according to the recursive type digital filter having the output compensation circuit 60 of the second embodiment, because the output compensation circuit 60 comprises the full adder 9, the register 10, and the flip flop 11, it is thereby possible to reduce the number of the full adders 9 in comparison with the output compensation circuit 6 in the first embodiment and possible to form the output compensation circuit 60 in the recursive type digital filter in a simple configuration.

Third embodiment

In the recursive type digital filters of the first and second embodiments, the value of the fixed data item stored in the fixed data register 7 is calculated and set in advance in accordance with the configuration of the arithmetic operation circuits in the recursive type digital filters, the significant digit, and the coefficient used by the multiplier 2. On the other hand, in the output compensation circuit of the third embodiment, the fixed data item is calculated and optionally set into the fixed data register 7 in advance in accordance with the significant digit of the arithmetic operation circuit in the recursive type digital filter and a significant digit of a circuit that is located in a following stage of the recursive type digital filter.

A description will now be given of the operation of the case in which the significant digit of the recursive type digital filter is 20 bits and the significant digit of the following circuit placed at the following stage is 16 bits, for example.

As have been described for the recursive type digital filters in the prior art and the first embodiment, firstly, when the data of zero is inputted into the input terminal 1 after an optional data item is inputted to the input terminal 1, and the data as the arithmetic operation result converges from a positive number to zero, the change of the 20 bit data item is expressed as follows:

0000000000000000.0010 (2), 0000000000000000.0001 (2), and 0000000000000000.0000 (2).

Thus, the output data item is almost equal to zero "0" during every outputting of the output data item through the output terminal 5 to external devices. After this, the output data item converges to zero. In addition, when the result of the arithmetic operation converges from a negative value to zero, the 20 bit data item expressed by using a 2's complement notation is as follows:

1111111111111111.1101 (2), 1111111111111111.1110 (2), and 1111111111111111.1111 (2).

Thus, this value converges to −1.

Here, because the significant digit of the following circuit is the 16 bits, if a value in a range of following two values is set as the fixed data item stored in the fixed data register 7 from 0000000000000000.0001 (2) to 0000000000000000.1111 (2), the value of the output provided through the output terminal 5 can converge to zero when it converges from a positive value to zero. Further, when the output value can converge from a negative value to zero, it converges to zero by causing an over flow.

This phenomenon will be explained by using actual data item as follows. For example, the following data item is set into the fixed data register 7 as the fixed data item:

0000000000000000.1111 (2).

When the output value converges from a positive value to zero, the following first two values are added:

0000000000000000.0000 (2)

0000000000000000.1111 (2)

0000000000000000.1111 (2).

The last data item in the three values described above designates the output from the output terminal 5. In this case, because the significant digit of the following circuit placed at the following stage after the stage of the recursive type digital filter is 16 bits, the following circuit uses only the first 16 bits:

0000000000000000 (2)

in the output data item of 20 bits. Therefore this output value is considered to be zero by the following circuit having the 16 bit significant digit.

In addition, when the output data item converges from a negative value to zero, the following first two values are added:

1111111111111111.1111 (2)

0000000000000000.1111 (2)

0000000000000000.1110 (2).

The last data item in the three values described above designates the output from the output terminal 5. In this case, because the significant digit of the following circuit placed at the following stage of the recursive type digital filter is 16 bits, the following circuit uses only the first 16 bits:

0000000000000000 (2)

in the output data item of 20 bits. Therefore this output value is considered to be zero by the following circuit having the 16 bit significant digit.

Thus, when the significant digit of the arithmetic circuit in the recursive type digital filter is greater than the significant digit of the following circuit and when an optional value corresponding to the difference of the two significant digits of both circuits is set as the fixed data item into the fixed data register 7, the output value provided by the recursive type digital filter is considered to be zero by the following circuit.

As described above, according to the third embodiment, when the significant digit of the arithmetic circuit in the recursive type digital filter is greater than the significant digit of the following circuit, an optional value corresponding to the difference of the two significant digits of both circuits is set as the fixed data item into the fixed data register 7. It is thereby possible to expand the setting range of this fixed data value. In addition to this effect, even if zero is inputted into the recursive type digital filter, the output value provided by the recursive type digital filter is considered to be zero by the following circuit. It is thereby possible to prevent a bad influence of the recursive type digital filter on the following circuit.

Fourth embodiment

Figure 5:
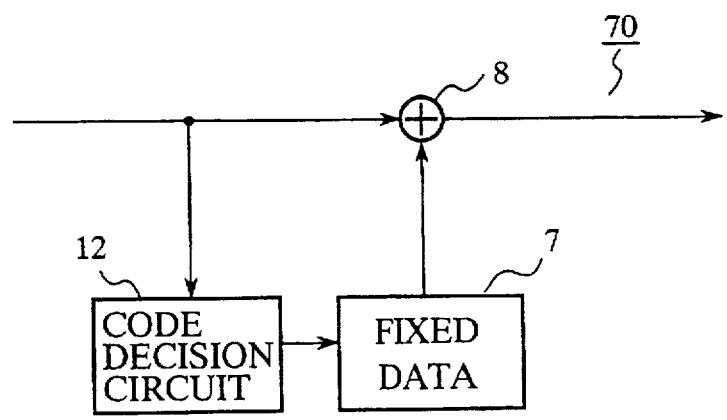
FIG. 5 is a block diagram showing another output compensation circuit as the fourth embodiment of the present invention.

FIG. 5 is a block diagram showing another output compensation circuit 70 as the fourth embodiment of the present invention. The output compensation circuit is a different type of the output compensation circuit of the recursive type digital filter of the present invention. In FIG. 5, the reference number 12 designates a code decision circuit for deciding the value of the code of the operation result of the recursive type digital filter. The addition circuit 8 adds the result data item of the recursive type digital filter with the fixed data item stored in the fixed data register 7 only when the code decision circuit 12 decides that the code of the arithmetic operation result of the recursive type digital filter is a negative value. Other components of the output compensation circuit in the recursive type digital filter as the fourth embodiment are the same as those of the output compensation circuit 6 of the first embodiment, therefore, the explanation of them is omitted here for brevity.

Next, a description will now be given of the output compensation circuit 70 as the fourth embodiment.

For example, when the following data item is obtained and provided through the output terminal 5 as the arithmetic operation result of the recursive type digital filter, 1111111111111111.1111 (2),
the code decision circuit 12 detects the upper most bit in this data item. In this case, because the code of the upper most bit is "1", the code decision circuit 12 decides that this data item is a negative value. The addition circuit 8 adds the arithmetic operation result of the recursive type digital filter with the fixed data item stored in the fixed data register 7 only when the code decision circuit 12 decides that the upper most bit of the data item as the operation result is a negative value.

For example, when the fixed data item is as follows:

0000000000000000.0001 (2), the following data item is output through the output terminal 5:

0000000000000000.0000 (2).

In this case, the operation is the same as that of the first embodiment.

On the contrary, when the arithmetic operation result is as follows:

0000000000000000.0000 (2), the code deciding circuit 12 detects the upper most bit of the arithmetic operation result. In this case, it is decided that the value of the upper most bit is a positive value because the upper most bit is "0".

Since the addition circuit 8 adds the arithmetic operation result of the arithmetic operation circuit incorporated in the recursive type digital filter with the fixed data item stored in the fixed data register 7 only when the code decision circuit 12 decides that the upper most bit of the data item as the operation result is a negative value, the following data item is directly output through the output terminal 5 as the output data item of the recursive type digital filter:

0000000000000000.0000 (2).

In the recursive type digital filter of the first embodiment, the operation result is added with the fixed data item, even if the operation result converges to zero and the following data item is obtained:

0000000000000000.0000 (2).

In the first embodiment, the following data item is output through the output terminal 5 as the output data item:

0000000000000000.0001 (2).

On the contrary, according to the fourth embodiment, it is not avoided to generate the above error in the recursive type digital filter.

In the fourth embodiment, the addition circuit 8 adds the arithmetic operation result of the arithmetic operation circuit in the recursive type digital filter with the fixed data item stored in the fixed data register 7 only when the code decision circuit 12 decides that the upper most bit of the data item as the operation result is a negative value. The present invention is not limited by this. For example, it can obtain the same effect that the value for canceling a rounding error and the value "0" are stored in the fixed data register 7 in advance, and the addition circuit 8 adds the arithmetic operation result of the arithmetic operation circuit in the recursive type digital filter with the fixed data item for canceling the rounding error only when the code decision circuit 12 decides that the upper most bit of the data item as the operation result is a negative value, and the addition circuit 8 adds the arithmetic operation result of the recursive type digital filter with the fixed data item of zero only when the code decision circuit 12 decides that the upper most bit of the data item as the operation result is a positive value. Therefore it is possible to provide the recursive type digital filter that is capable of avoiding the occurrence of an error of an infinitely small value generated by adding the fixed data item even if the arithmetic operation result converges to zero.

As described above in detail, according to the present invention, the recursive type digital filter comprises the output compensation circuit that is capable of compensating the output data item of the arithmetic operation circuit incorporated in the recursive type digital filter so that the value of "zero" is output as an output data item of the recursive type digital filter even if the zero is inputted as an input data item.

In addition, according to the present invention, a rounding error caused when the value of zero is inputted to the arithmetic operation circuit incorporated in the recursive type digital filter as an input data is set as a fixed data item, and the recursive type digital filter comprises the output compensation circuit that adds the output data item as the operation result of the arithmetic operation circuit with this fixed data item. It is thereby possible to obtain the effect that the value of zero can be output accurately as the output data of the recursive type digital filter even if the value of zero is inputted as an input data item.

Furthermore, according to the present invention, when the arithmetic operation circuit incorporated in the recursive type digital filter operates a data item of m digits (m is a natural number not less than 2) and a circuit in a following stage of the recursive type digital filter operates a data item of n digits (n<m, n is a natural number), the (m−n) digits of the output data item counted from the least significant digit are stored in advance as the fixed data item, and the output compensation circuit incorporated in the recursive type digital filter adds the output data item of the arithmetic operation circuit with the fixed data item. It is thereby possible to expand the setting range of the fixed data item. In addition to this effect, it is possible to obtain the recursive type digital filter that is capable of avoiding an influence to the following circuit because the output data item from the recursive type digital filter is regarded as being the value of zero by the following circuit even if the value of zero is inputted as an input data item.

Moreover, according to the present invention, the output compensation circuit comprises the code decision circuit for deciding the code of the output data item of the arithmetic operation circuit incorporated in the recursive type digital filter and addition circuit for adding the output data item from the arithmetic operation circuit with the fixed data item when the code of the output data item of the arithmetic operation circuit is decided as a negative value by the code decision circuit. It is therefore possible to provide the recursive type digital filter that is capable of avoiding occurrence of an error of an infinitely small value generated by adding the fixed data item even if the output data item of the arithmetic operation circuit converges to zero.

While the above provides a full and complete disclosure of the preferred embodiments of the present invention, various modifications, alternate constructions and equivalents may be employed without departing from the true spirit and scope of the invention. Therefore the above description and illustration should not be construed as limiting the scope of the invention, which is defined by the appended claims.

What is claimed is:

1. A recursive digital filter comprising:
   a recursive arithmetic operation circuit for performing an arithmetic operation on input data having a fixed number of significant digits and for producing output data having a desired frequency characteristic; and
   an output compensation circuit for compensating the output data to produce an output data item of zero when the input data is zero.

2. The recursive digital filter as claimed in claim 1, wherein the output compensation circuit determines a value of a rounding error caused when the input data is zero as a fixed data item in accordance with significant digits of the recursive arithmetic operation circuit and coefficients used for the arithmetic operation in the recursive type arithmetic operation circuit, and adds the output data item to the fixed data item.

3. The recursive digital filter as claimed in claim 2, wherein the output compensation circuit comprises:

a code decision circuit for deciding a code of the output data; and an addition circuit for adding the output data to the fixed data item when the code decision circuit decides that the output data is negative.

4. The recursive digital filter as claimed in claim 2, wherein the output compensation circuit comprises:

a register for storing the fixed data item; and an addition circuit for adding the output data to the fixed data item stored in the register.

5. The recursive digital filter as claimed in claim 4, wherein the addition circuit comprises a plurality of full adders.

6. The recursive digital filter as claimed in claim 1, wherein the recursive arithmetic operation circuit performs the arithmetic operation for the input data, the input data having m significant digits, m being a natural number not less than 2, and outputs the output data having the desired frequency characteristic and m significant digits, wherein when a next-stage circuit coupled to the output compensation circuit is configured to process n significant digits, n being a natural number less than m, the output compensation circuit stores a data item of (m−n) significant digits, as a fixed data item, the (m−n) significant digits being counted from a least significant digit in the output data, and adds the output data to the fixed data item.

7. The recursive digital filter as claimed in claim 6, wherein the output compensation circuit comprises:

a code decision circuit for deciding a code of the output data; and an addition circuit for adding the output data to the fixed data item when the code decision circuit decides that the output data is negative.

8. The recursive digital filter as claimed in claim 7, wherein the fixed data item includes m−n significant digits.

9. The recursive digital filter as claimed in claim 6, wherein the output compensation circuit comprises:

a register for storing the fixed data item; and an addition circuit for adding the output data to the fixed data item stored in the register.

10. The recursive digital filter as claimed in claim 9, wherein the output compensation circuit comprises:

a full adder having first and second data input terminals, a carry input terminal, a data output terminal, and a carry output terminal, the first data input terminal receiving the output data from the arithmetic operation circuit;

a flip flop circuit coupled to the carry output terminal and the carry input terminal; and a register coupled to the second data input terminal, wherein the flip flop circuit carries an output result of an addition operation performed by the full adder, between the output data produced by the recursive arithmetic operation circuit and the fixed data item stored in the register by one digit when a carry occurs.

11. The recursive digital filter as claimed in claim 9, wherein the fixed data item stored in the data register includes m−n significant digits.

* * * * *